(12) United States Patent
Schäfer

(10) Patent No.: US 10,576,940 B2
(45) Date of Patent: Mar. 3, 2020

(54) WIPING DEVICE AND METHOD FOR WIPING AN OPTICAL ELEMENT, AND REAR VIEW DEVICE OR DRIVER ASSISTANCE DEVICE FOR USE IN A VEHICLE

(71) Applicant: SMR Patents S.à.r.l., Luxembourg (LU)

(72) Inventor: Henrik Schäfer, Stuttgart (DE)

(73) Assignee: SMR Patents S.à.r.l., Luxembourg (LU)

( * ) Notice: Subject to any disclaimer, the term of this patent is extended or adjusted under 35 U.S.C. 154(b) by 101 days.

(21) Appl. No.: 15/872,686

(22) Filed: Jan. 16, 2018

(65) Prior Publication Data

US 2018/0201230 A1 Jul. 19, 2018

(30) Foreign Application Priority Data

Jan. 16, 2017 (DE) .................. 10 2017 100 741

(51) Int. Cl.
| | |
|---|---|
| *B60S 1/56* | (2006.01) |
| *B60S 1/08* | (2006.01) |
| *G02B 27/02* | (2006.01) |
| *B08B 1/00* | (2006.01) |
| *B60K 35/00* | (2006.01) |

(Continued)

(52) U.S. Cl.
CPC ............ *B60S 1/56* (2013.01); *B08B 1/001* (2013.01); *B08B 1/008* (2013.01); *B60K 35/00* (2013.01); *B60R 1/00* (2013.01); *B60S 1/08* (2013.01); *B60S 1/3402* (2013.01); *B60S 1/566* (2013.01);

(Continued)

(58) Field of Classification Search
None
See application file for complete search history.

(56) References Cited

U.S. PATENT DOCUMENTS

2003/0000040 A1    1/2003  Trajkovic et al.
2007/0204421 A1*   9/2007  Alliman ............... B60S 1/0405
                                                          15/250.3

(Continued)

FOREIGN PATENT DOCUMENTS

DE    2152978 A1    10/1971
DE    2837993 C2    8/1978

(Continued)

OTHER PUBLICATIONS

German Search Report dated Jan. 16, 2017.

*Primary Examiner* — William B Perkey
(74) *Attorney, Agent, or Firm* — Jones Day

(57) ABSTRACT

A wiping device for wiping an optical element clean of water or of particles includes a housing and a wiping element able to undergo a movement with respect to the housing, where the wiping device is configured to move in such a manner that such movement is caused by coupling a first unit in or on the wiping element with a second unit in the housing via a time-variable electromagnetic field. The wiping device may be used for wiping the surface of a lens or of a window, which lens or window is transmissive to visible light, ultraviolet radiation, and/or infrared radiation, and is preferably placed in front or as part of a camera. In addition, a rear view device or driver assistant device for use in or on a vehicle including such a wiping device, and a method for wiping an optical element are provided.

7 Claims, 2 Drawing Sheets

(51) Int. Cl.
    *B60R 1/00*         (2006.01)
    *B60S 1/34*         (2006.01)
    *G02B 27/00*      (2006.01)
    *H05K 5/06*        (2006.01)

(52) U.S. Cl.
    CPC ...... *G02B 27/0006* (2013.01); *B60K 2370/21* (2019.05); *H05K 5/069* (2013.01)

(56) References Cited

U.S. PATENT DOCUMENTS

| | | | |
|---|---|---|---|
| 2017/0151933 A1* | 6/2017 | Doorley | B60S 1/56 |
| 2018/0201230 A1* | 7/2018 | Schafer | B60S 1/566 |
| 2018/0215350 A1* | 8/2018 | Herrmann | B60S 1/0848 |

FOREIGN PATENT DOCUMENTS

| | | |
|---|---|---|
| DE | 9111395 U1 | 9/1991 |
| DE | 4443615 A1 | 12/1994 |
| DE | 29514364 U1 | 9/1995 |
| DE | 10010754 A1 | 3/2000 |
| DE | 10240178 A1 | 3/2004 |
| DE | 102013213415 A1 | 1/2015 |
| EP | 1457398 A2 | 9/2004 |
| EP | 2792556 A1 | 10/2014 |
| EP | 3162610 A1 | 5/2017 |

\* cited by examiner

# WIPING DEVICE AND METHOD FOR WIPING AN OPTICAL ELEMENT, AND REAR VIEW DEVICE OR DRIVER ASSISTANCE DEVICE FOR USE IN A VEHICLE

CROSS-REFERENCE TO RELATED APPLICATIONS

This application claims the benefit of foreign priority to German Patent Application No. DE 10 2017 100 741.5, filed Jan. 16, 2017, which is incorporated by reference herein in its entirety for all purposes.

BACKGROUND

1. Field of the Invention

The following description relates to a wiping device for wiping an optical element. For example, for wiping the surface of a lens or of a window which is transmissive to visible light, ultraviolet radiation, and/or infrared radiation. The lens or window is preferably placed in front of or as part of a camera such as used in a rear view device or in a driver assistance device in or on a vehicle. A rear view device or driver assistance device for use in or on a vehicle may include such a wiping device. Also described is a method of wiping an optical element, specifically in front of a camera of a rear view device or driver assistance device, or as part of such a camera.

2. Related Art

A problem with typical wiping devices is that a wiping element (such as one having a wiper blade) needs to be moved by means of some mechanical arrangement with respect to the housing. Since the mechanism extends from the housing to the wiping element, the housing cannot be sealed well enough as to protect a camera in the manner needed. Furthermore, an electronic connection is needed between the inside and the outside of the housing. The so-called camera pod and the electronic connection (i. e. cables) provide for weak sealing of the housing and bad protection of the camera from moisture and dust.

DE 28 37 993 C2 describes the use of a linear motor with a wiper unit, i.e. using a time-variable electromagnetic field.

DE 100 10 754 A1 describes a linear wiper system including a guiding profile as a stator on which a rotor is guided, the rotor bearing a wiper element.

US 2003/0000040 A1 describes a windshield wiper that is moved across a windshield by a linear motor employing an induction effect.

DE 21 52 978 A describes a drive unit for a windshield wiper with a linear motor formed by a guide profile and a movable element that bears the wiper.

EP 1 457 398 A2 describes a vehicle windshield wiper system having a sliding train to which the windshield wiper blade is connected, the sliding train being slidable on a rail by means of coils of a linear motor.

EP 3 162 610 A1 describes a foreign-material removing device having a liquid jetting unit that washes away foreign matter, which is present in an area through which a magnetic field generated in a wireless supply of power.

DE 91 11 395 U1 describes a windshield wiper with a frame including two parallel grooves in which a wiper support is movable.

DE 295 14 364 U1 describes an image acquisition unit in a vehicle including a camera in a housing and a wiper for cleaning the housing's front surface.

EP 2 792 556 A1 describes a wiper unit wherein a drive means includes an element having a shape-memory.

DE 10 2013 213 415 A1 describes a unit in a vehicle for obtaining images with a camera having a top cover, and a wiper for the cover surface.

DE 44 43 615 A1 describes a wiper unit for a windshield having an arbitrary edge contour, with a groove being formed at the edge, wand with a wiper element being slidable therein.

DE 102 40 178 A1 describes a rear view mirror with two parallel grooves for guiding a slade with a wiper blade.

SUMMARY

In an aspect, the following description provides a way to better seal a housing or wiping device, specifically a housing which includes a camera in its interior. Further, the following description describes a rear view device or driver assistance device for use in or on a vehicle, with a camera in a housing and a wiping device, where sealing of the camera is improved. A further object is to provide for a suitable method of wiping an optical element, in particular the surface of a lens or window in front of or as part of a camera in a housing of a rear view device or driver assistance device for use in or on a vehicle.

In another aspect, a wiping device is provided with the features of independent claim 1, a rear view device or driver assistance device for use in or on a vehicle is provided with the features of independent claim 6, and a method of wiping an optical element is provided with the features of independent claim 7.

The wiping device may be configured in such a manner that the movement which the wiping element is able to undergo is caused by coupling a first unit of the wiping element with a second unit in the housing via a time-variable electromagnetic field. In other words, a first unit is placed in or on the wiping element and a second unit is placed in the housing. These units may not need to be directly coupled since an electromagnetic field provides for an indirect coupling. The electromagnetic field may vary over time, preferably at least in part periodically.

A travel groove may be formed in or by a wall of the housing, and a portion of the wiping element may be fit into the travel groove for travelling therein.

In at least one aspect, one advantage lies in there being no longer a need to provide for a mechanical coupling or at least an electronic connection between the housing and wiping element. That, in turn, allows the housing to be sealed in an optimum manner thereby providing better protection for a camera in its interior.

Preferably, the first unit of the wiping device includes a rotor and the second unit includes a stator of an electromotor. The techniques of electromotors are well-known such that this preferred embodiment can be put into practice by one having ordinary skill in the art. The movement of the wiping device is usually known to be a rotation. The electromagnetic coupling presently allows any kind of trajectory of the wiping element. A preferred embodiment includes that the movement of the wiping device is a linear movement, in particular as caused by a linear electromotor. Then, the arrangement of respective coils is simple, as is the arrangement of respective elements in the wiping element. Specifically, if the linear movement is horizontal (with respect to the desired mounting or integration of the wiping device as, e.g. in or on a vehicle), such linear movement parallel to the ground allows to suppress effects of gravity on varying portions of the wiping elements. The linear movement may also be an up and down movement.

In a preferred embodiment, two electric motors of which the respective motors are arranged at opposite sides of the wiping element, most preferably at opposite ends thereof, are provided. As a result, this allows most stably bearing and moving the wiping element.

It is preferred that the housing is undercut to at least form a portion of that travel groove, and the portion of the wiping element is of such shape that it cannot exit the travel groove where the housing is undercut. Still further, the undercut housing may have a T-shaped portion, over which a C- or a U-shaped portion of the wiping element is slidably fit. The travel groove when it is undercut, preferably with the mentioned shapes, allows the most stable bearing of the wiping element both in a stationary state and when it is moving.

In a preferred embodiment of the wiping device, the wiping element may include a wiper blade and the movement of the wiping element may cause the wiper blade to wipe an essentially planar surface. Such planar surface can be the front surface of a planar, sheet-like window, which facilitates cleaning of that surface from water or particles.

In the preferred embodiment, as already mentioned above, the housing houses a camera. It is preferred that the housing is sealed from water in order to protect the camera from water and/or dust particles or other particles.

The rear view device or driver assistance device for use in or on a vehicle may include a wiping device as explained above, and a camera housed in a sealed manner in the rear view device or driver assistance device. The camera may be behind the lens or a window, where that lens or window is transmissive to visible light, to ultraviolet radiation and/or infrared radiation. The rear view device or driver assistance device may further include either a display device (in a manner allowing data transmission from the camera for displaying images taken with the camera), or an evaluation device connected to said camera (in order to transmit respective data from the camera for evaluating data obtained by the camera), or may include both such display device and evaluation device.

By using the inventive wiping device in such a rear view device or driver assistance device, the camera can be most perfectly sealed from water and/or dust or other particles.

The method of wiping an optical element, in particular of wiping the surface of a lens or window, which lens or window is transmissive to visible light, ultraviolet radiation, and/or infrared radiation, includes moving a wiping element with a specific housing by means of electromagnetic fields which correspond to elements within the housing and which are acting outside of the housing. By abandoning the idea of having electromagnetic fields in an electromotor within the housing, i.e. by having the electromagnetic fields caused within the housing but emitted to the outside of the housing and, for instance, received by an element within the wiping element, the housing can be perfectly sealed thus enabling the protection of a camera in the housing from water and/or particles.

Therefore, it is the astonishing perception of the invention, that a wiper blade can ensure the side of a camera is contact free with respect to the housing of the camera ensuring a sealed arrangement of the camera within the housing. This is achieved by making usage of the electromagnetic field, preferably with linear electro motors being used.

BRIEF DESCRIPTION OF DRAWINGS

The present invention will be better understood from the following description of a preferred embodiment which is described with respect to the drawing, in which.

DETAILED DESCRIPTION

Figure 1:
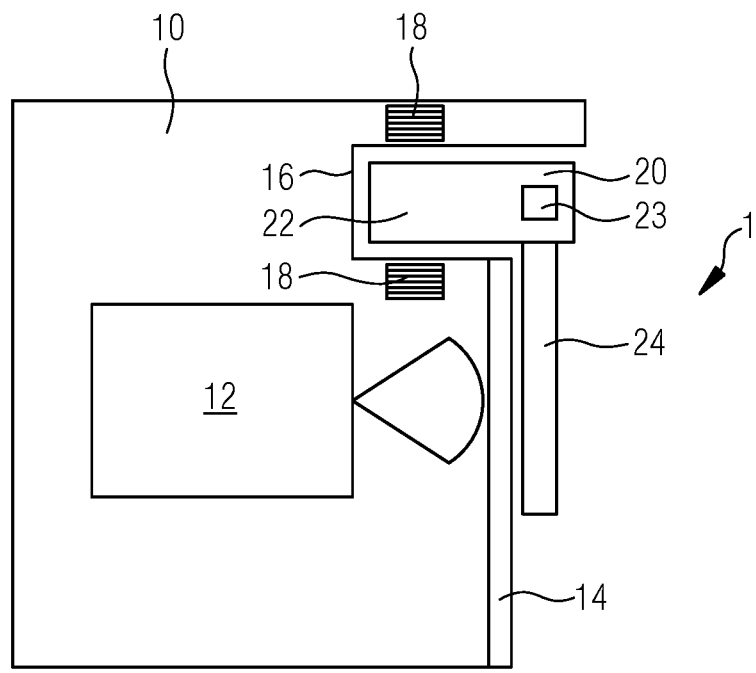
FIG. 1 is a diagram illustrating a cross section of a wiping device including a camera in a housing together with further electronic elements or processing elements.

A wiping device generally indicated as 1 includes a housing 10 and a wiper element 20. The housing 10 houses a camera 12 placed behind a window 14 which is transmissive to visible light. In the housing, a travel groove 16 is formed, about which coils 18 are wound. FIG. 1 shows the coils 18 in a cross section, and the lower and upper parts both belong to one and the same coils. The wiping element 20 includes a protrusion 22 travelling in the groove 16 as suspended on a longitudinal axis 23. A wiper blade 24 is attached to the protrusion 22. The protrusion 22 bears a permanent magnet indicated at 26, which acts as a rotor of a linear motor.

Figure 2:
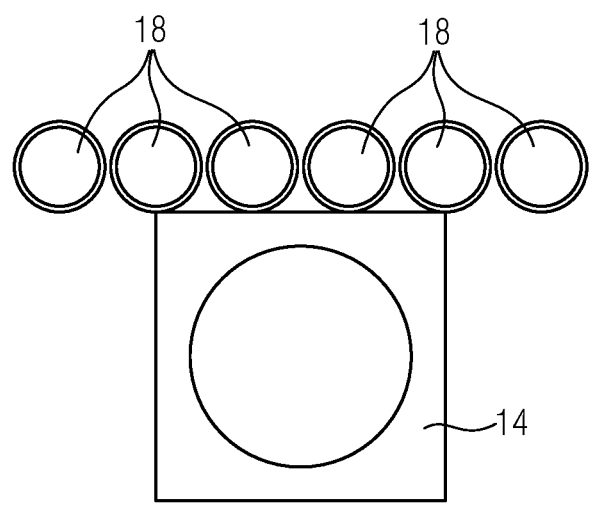
FIG. 2 is a diagram illustrating a front view of the housing.
Figure 3:
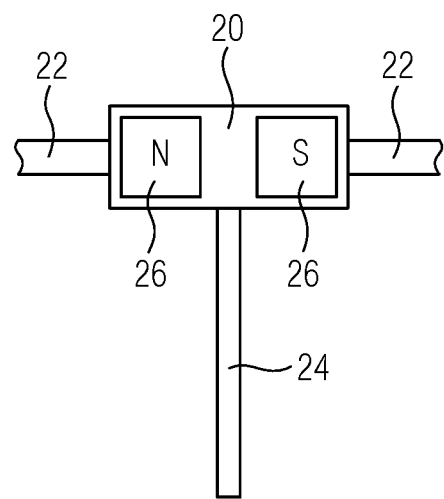
FIG. 3 is a diagram illustrating a front view of the wiping elements.

The coils 18 are, as best seen in FIG. 2, provided in a linear sequence, thereby forming a stator of such a linear motor. By exciting the coils 18 in an alternating manner, and namely periodically, the linear motor works, and the protrusion 22 is driven in the groove 16 such as to undergo a linear movement. The wiper blade 24 then wipes the front surface of the window 14.

Figure 4:
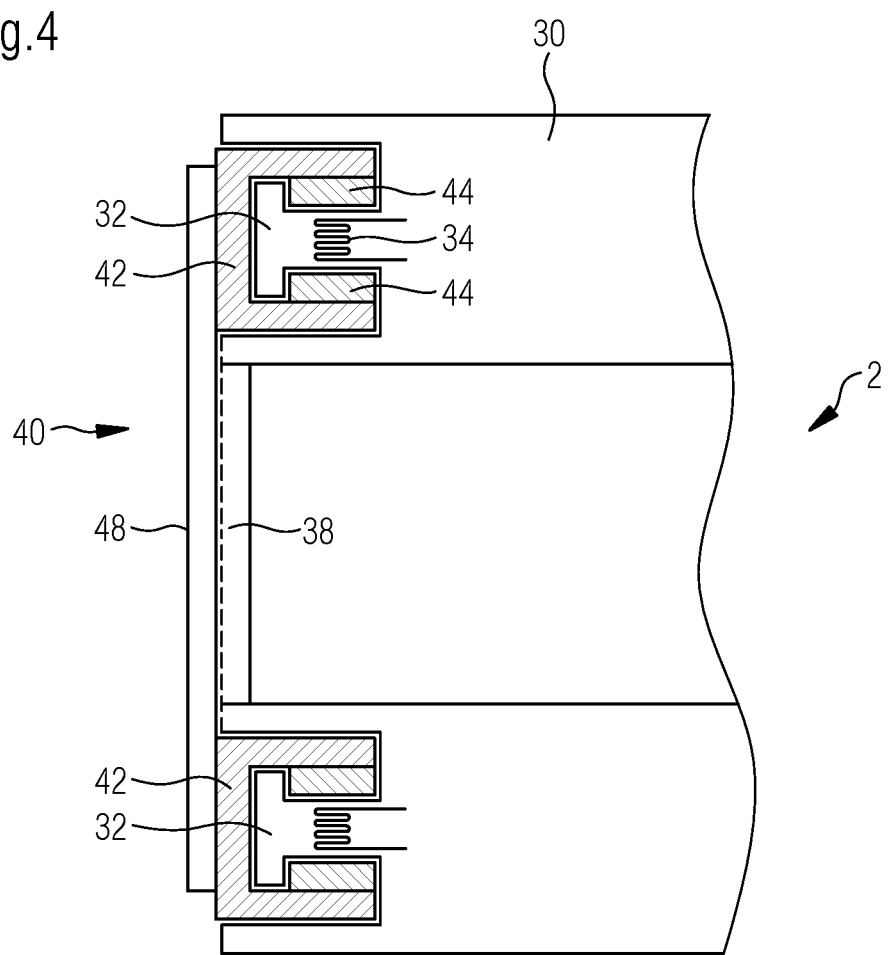
FIG. 4 is a diagram illustrating a cross section of another embodiment of the wiping device.

In another embodiment, as shown in FIG. 4 and generally indicated as 2, the housing 30 forms a groove which is undercut by means of a T-shaped proportion 32. This allows fixing of a wiping element 40 by means of a C-shaped armature 42. Here, the coils 34 are placed within the T-shape, and permanent magnets 44 are arranged at the two opposite ends of the C-shaped armature 42. The housing 30 includes two such grooves, so that the wiping element 40 can have two C-shaped armatures 42 travel in the respective undercut groove, and the wiper blade 48 is most stably guided along the front surface of an optical window 38.

Although the above embodiments both describe a linear movement for the wiping elements 20 or 40, respectively, other trajectories are possible. For example, a circular motion (i.e. a rotation) of the wiping element might be chosen as well.

Features of the embodiments of the present invention disclosed in the above description, in the claims, and in the drawings, can be essential both individually and in any combination required in order to realize the invention in its different embodiments.

REFERENCE SIGN LIST 1, 2 wiping device
10 housing
12 camera
14 window
16 travel groove
18 coils
20 wiper element 22 protrusion
23 longitudinal axis
24 wiper blade
26 permanent magnet
28 permanent magnet
30 housing
32 T-shaped portion
34 coils
38 window
40 wiping element
42 C-shaped armature
44 permanent magnets
48 wiper blade

What is claimed is:

1. A wiping device for wiping an optical element which is transmissive to at least one of visible light, ultraviolet radiation and infrared radiation, and placed in front of or as part of a camera, the wiping device comprising:
   a housing comprising a wall;
   a wiping element configured to move with respect to the housing;
   a first unit in or on the wiping element; and
   a second unit in the housing; and
   a travel groove formed in or by the wall of the housing, wherein the movement of the wiping element is caused by
      a coupling of the first unit with the second unit via a time-variable electromagnetic field, and
   at least a portion of the wiping element is fit into the travel groove of the housing for travelling therein.

2. The wiping device of claim 1, wherein the first unit is a rotor and the second unit is a stator of an electromotor.

3. The wiping device of claims 1, wherein the movement of the wiping device is a linear movement.

4. The wiping device of claim 3, further comprising two electric motors each having a rotor, the two rotors being arranged at an opposite side or opposite end of the wiping element.

5. The wiping device of claim 1, wherein
   the housing is undercut to form at least a portion of the travel groove, and the portion of the wiping element is of such shape that it cannot exit the travel groove where the housing is undercut, and
   the housing has a T-shaped protrusion over which a C-shaped portion of the wiping element is slideably fit.

6. A rear view device or a driver assistance device for use in or on a vehicle, comprising:
   a wiping device according to claim 1;
   a camera housed and sealed in the housing of the wiping device behind a lens or a window, the lens or the window being transmissive to at least one of visible light, ultraviolet radiation, and infrared radiation, the surface of which is wipable by the wiping element of the wiping device; and
   at least one of a display device connected to the camera for displaying images taken with the camera and an evaluation device connected to the camera for evaluating data of the camera.

7. A method for wiping an optical element, which is transmissive to at least one of visible light, ultraviolet radiation, and infrared radiation, the method comprising:
   providing the wiping device of claim 1;
   moving the wiping element of the wiping device with respect to the housing of the wiping device by means of electromagnetic fields created by elements within the housing and taking effect, at least in part, outside of the housing.

* * * * *